(12) United States Patent
Ibara et al.

(10) Patent No.: US 6,724,057 B2
(45) Date of Patent: Apr. 20, 2004

(54) SEMICONDUCTOR DEVICE WITH REDUCED SHORT CIRCUITING BETWEEN GATE ELECTRODE AND SOURCE/DRAIN REGION

(75) Inventors: Yoshikazu Ibara, Gifu (JP); Yoshio Okayama, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/734,596

(22) Filed: Dec. 13, 2000

(65) Prior Publication Data

US 2002/0017691 A1 Feb. 14, 2002

(30) Foreign Application Priority Data

Dec. 14, 1999 (JP) .............................. 11-353807
Mar. 7, 2000 (JP) ........................ 2000-061565

(51) Int. Cl.⁷ .......................... H01L 29/76; H01L 29/94
(52) U.S. Cl. ...................... 257/412; 257/383; 257/388; 257/413
(58) Field of Search ................................. 257/382, 383, 257/384, 388, 411, 412, 413, 755, 757, 761, 763, 900; 438/184, 230, 265, 300, 303, 585, 587, 588, 592, 595

(56) References Cited

U.S. PATENT DOCUMENTS

| | | | | |
|---|---|---|---|---|
| 4,638,347 A | * | 1/1987 | Iyer ............................ | 257/386 |
| 5,268,330 A | * | 12/1993 | Givens et al. ................ | 438/586 |
| 5,656,519 A | * | 8/1997 | Mogami ...................... | 438/303 |
| 5,682,055 A | * | 10/1997 | Huang et al. ................. | 257/408 |
| 6,001,726 A | * | 12/1999 | Nagabushnam et al. .... | 438/618 |

FOREIGN PATENT DOCUMENTS

| | | |
|---|---|---|
| JP | 61-166075 | 7/1986 |
| JP | 4-186733 | 7/1992 |
| JP | 5-90293 | 4/1993 |
| JP | 5-218410 | 8/1993 |
| JP | 7-66406 | 3/1995 |
| JP | 7-86583 | 3/1995 |
| JP | 7-263690 | 10/1995 |
| JP | 8-241990 | 9/1996 |
| JP | 8-255766 | 10/1996 |
| JP | 9-237892 | 9/1997 |
| JP | 10-65171 | 3/1998 |
| JP | 11-135788 | 5/1999 |

* cited by examiner

*Primary Examiner*—Hung Vu
(74) *Attorney, Agent, or Firm*—McDermott, Will & Emery (57) ABSTRACT

A semiconductor device capable of effectively preventing defective short-circuiting across a gate electrode and an impurity region and reducing the resistance of the gate electrode and the impurity region is provided. In this semiconductor device, a first gate film is formed on a channel region through a gate insulator film. A second gate film consisting of a first compound layer is formed on the first gate film. A second compound layer is formed on the surface of the impurity region. A reaction preventing film for preventing the first compound layer and the second compound layer from reacting with each other is formed on the second gate film. The first and second compound layers are formed independently of each other without reaction in the process of formation due to the reaction preventing film. Thus, defective short-circuiting across the gate electrode and the impurity region is effectively prevented while process tolerance is increased.

4 Claims, 10 Drawing Sheets

SEMICONDUCTOR DEVICE WITH REDUCED SHORT CIRCUITING BETWEEN GATE ELECTRODE AND SOURCE/DRAIN REGION

BACKGROUND OF THE INVENTION

1. Field of the Invention

The present invention relates to a semiconductor device and a method of fabricating the same, and more particularly, it relates to a semiconductor device having a gate electrode and a method of fabricating the same.

2. Description of the Prior Art

A salicide (self-aligned silicide) process is generally known as a process for reducing the resistance of a gate electrode and source/drain regions of a MOS transistor. In this salicide process, a low-resistance metal silicide film is formed on the gate electrode and the source/drain regions in a self-aligned manner.

When employing the aforementioned salicide process in a step of forming a MOS transistor, extremely high-grade technique is required for setting conditions in this step. If a heat treatment (annealing) temperature is excessive, for example, silicide films grow also on side wall spacers, to disadvantageously result in defective short-circuiting (bridging) across the gate electrode and the source/drain regions.

Figure 18:
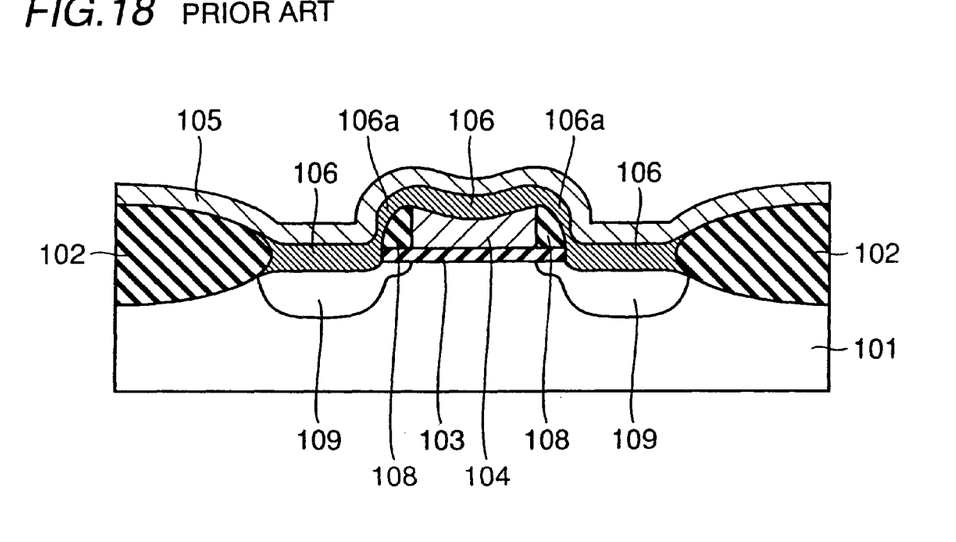
FIGS. 18 and 19 are sectional views for illustrating problems in a fabrication process for a conventional semiconductor device.

FIG. 18 is a sectional view of a conventional semiconductor device for illustrating defective bridging. Defective bridging in the conventional semiconductor device is now described in detail with reference to FIG. 18. In the conventional semiconductor device, field oxide films 102 are formed on element isolation regions of a silicon substrate 101. A pair of source/drain regions 109 are formed on an element forming region enclosed with the field oxide films 102, to hold a channel region therebetween. A gate electrode 104 consisting of a polycrystalline silicon film is formed on the channel region through a gate insulator film 103. Side wall spacers 108 are formed on both side walls of the gate electrode 104.

In order to apply the salicide process to the conventional semiconductor device having the aforementioned structure, a Ti film 105 is first formed on the overall surface. Thereafter heat treatment is performed for simultaneously forming metal silicide films 106 on the upper surface of the gate electrode 104 and the surfaces of the source/drain regions 109. If the heat treatment (annealing) temperature is excessive in this case, metal silicide films 106a abnormally grow on the side wall spacers 108, to disadvantageously short-circuit the gate electrode 104 and the source/drain regions 109.

When the heat treatment (annealing) temperature is too small contrarily to the above, the silicide films 106 so insufficiently grow that the resistance cannot be sufficiently reduced by the salicide process.

Thus, the range of the conditions for setting the heat treatment is narrow in the conventional salicide process, to disadvantageously result in small process tolerance (process margin).

In order to cope with such an inconvenience that the resistance cannot be sufficiently reduced by the salicide process, Japanese Patent Laying-Open No. 10-65171 (1998) proposes a method of supplying a sufficient silicide film to a gate electrode. According to this proposed technique, the gate electrode is formed by two layers of a polysilicon layer and a first Ti silicide layer while a second Ti silicide layer is formed on the gate electrode and source/drain regions. Thus, the first and second TI silicide layers define a thick silicide layer for the gate, so that the gate electrode can be formed with a sufficient silicide film as compared with the general salicide process.

Also in the aforementioned proposed technique, however, defective bridging may be caused across the gate electrode and the source/drain regions when forming the second Ti silicide layer, and it is difficult to solve the problem of such defective bridging. In general, therefore, defective short-circuiting (defective bridging) must regularly be taken into consideration and hence the process margin (process tolerance) is disadvantageously reduced.

Figure 19:
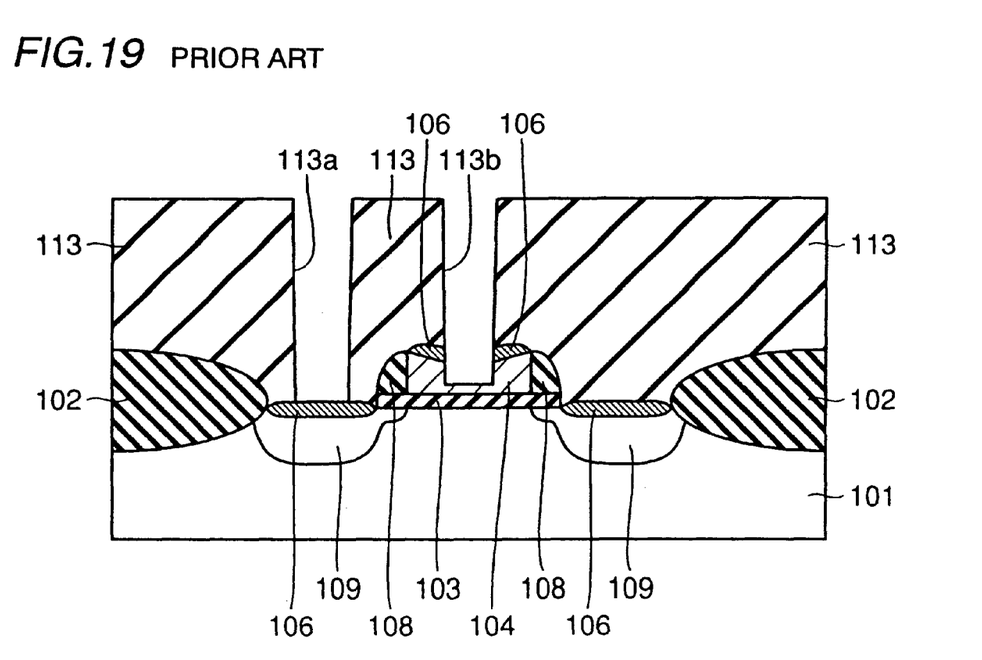

When forming contact holes 113a and 113b in an interlayer isolation film 113 covering the overall surface by etching upon employment of the salicide process as shown in FIG. 19, the etching may not be stopped in the metal silicide film 106 formed on the gate electrode 104 due to the difference between the thicknesses of portions of the interlayer isolation film 113 located on the source/drain regions 109 and the gate electrode 104.

In this case, the contact hole 113b passes through the metal silicide film 106 to reach the gate electrode 104, and further reaches the gate insulator film 103 at the worst. In this case, the gate insulator film 103 is damaged to deteriorate the characteristics of the gate electrode 104. When the contact hole 113b passes through the metal silicide film 106 to reach the gate electrode 104, it follows that an upper-layer wire comes into contact only with the side surfaces of the metal silicide film 106 and hence the contact area between the upper-layer wire and the metal silicide film 106 is reduced. Thus, contact characteristics are also disadvantageously deteriorated.

SUMMARY OF THE INVENTION

An object of the present invention is to provide a semiconductor device capable of effectively preventing a gate electrode and impurity regions from defective short-circuiting and reducing the resistance of the gate electrode and the impurity regions.

Another object of the present invention is to prevent a contact hole formed on the gate electrode from punch-through in the aforementioned semiconductor device.

Still another object of the present invention is to provide a method of fabricating a semiconductor device capable of readily forming a low-resistance compound layer by increasing process tolerance.

A semiconductor device according to an aspect of the present invention comprises a pair of impurity regions, a first gate film, a second gate film, a second compound layer and a reaction preventing film. The pair of impurity regions are formed on the main surface of a semiconductor substrate at a prescribed interval to hold a channel region therebetween. The first gate film is formed on the channel region through a gate insulator film. The second gate film is formed on the first gate film, and consists of a first compound layer. The second compound layer is formed on the surfaces of the impurity regions. The reaction preventing film is formed on the second gate film for preventing reaction between the first compound layer and the second compound layer. In the present invention, the term "semiconductor substrate" indicates a wide concept including not only a general semiconductor substrate but also a semiconductor thin film or the like.

In the semiconductor device according to the aforementioned aspect, the reaction preventing film for preventing reaction between the first compound layer and the second compound layer is so provided that the first compound layer and the second compound layer are formed independently of each other without reaction, whereby the first compound layer and the second compound layer are prevented from connection. Thus, the gate electrode and the impurity regions can be effectively prevented from defective short-circuiting. The first compound layer and the second compound layer are formed independently of each other without reaction, whereby process tolerance is increased. Thus, the first and second compound layers can be readily formed in lower resistance as compared with the prior art, for consequently reducing the resistance of the gate electrode and the impurity regions. Thus, the speed of the semiconductor device can be increased.

In the semiconductor device according to the aforementioned aspect, the reaction preventing film preferably includes a conductive film consisting of a material selected from a group consisting of a low-resistance metal, a high melting point metal and a high melting point metal compound. When formed by such a conductive film, the reaction preventing film serves as parallel resistance of the gate electrode, whereby the resistance of the gate electrode can be further reduced. Consequently, the speed of the semiconductor device can be further increased.

Preferably, the semiconductor device according to the aforementioned aspect further comprises an interlayer isolation film formed to cover the second gate film and the second compound layer, and the reaction preventing film contains a material having a high etching selection ratio with respect to the interlayer isolation film. When prepared from a material having a high selection ratio with respect to the material for the interlayer isolation film such as a silicon oxide film in the aforementioned manner, the reaction preventing film can be employed as an etching stopper film when forming a contact hole in the interlayer isolation film by etching. Thus, the contact hole can be effectively prevented from passing through the first compound layer and reaching the first gate film. Consequently, it is possible to prevent deterioration of the gate electrode characteristics resulting from damage of the gate insulator film caused when the contact hole reaches the gate insulator film or deterioration of contact characteristics resulting from reduction of a contact area between the first compound layer and an upper layer wire. In this case, the reaction preventing film preferably includes a film consisting of a material selected from a group consisting of a nitrogen compound, an oxide other than an Si oxide, a high melting point metal and a high melting point metal compound. The reaction preventing film having a high etching selection ratio with respect to the interlayer isolation film consisting of a silicon oxide film or the like can be readily formed by employing the aforementioned material.

In the semiconductor device according to the aforementioned aspect, the reaction preventing film preferably includes a film consisting of a material selected from a group consisting of a high melting point Si compound, a high melting point metal and a high melting point metal compound. When prepared from such a material having high chemical resistance and high heat resistance, the reaction preventing film can prevent the gate electrode from exposure to a high-temperature mixed solution of ammonia and hydrogen peroxide or the like employed for treatment in a washing step carried out before forming the interlayer isolation film, for example. Further, the reaction preventing film having high heat resistance can effectively prevent the first compound layer, located under the reaction preventing film, from deformation caused by heat.

A semiconductor device according to another aspect of the present invention comprises a pair of impurity regions, a gate electrode consisting of a single layer, a first compound layer, a second compound layer and a side wall insulator film consisting of a single layer. The pair of impurity regions are formed on the main surface of a semiconductor substrate at a prescribed interval to hold a channel region therebetween. The gate electrode is formed on the channel region through a gate insulator film. The first compound layer is formed on the gate electrode. The second compound layer is formed on the surfaces of the impurity regions. The side wall insulator film is formed on the side surface of the gate electrode, and has a first concave portion on its surface.

In the semiconductor device according to the aforementioned aspect, the side wall insulator film consisting of a single layer having the first concave portion is provided on the side surface of the gate electrode consisting of a single layer for separating a conductor film for forming the first compound layer and the second compound layer in a self-aligned manner with the first concave portion in the process of formation. Thus, a solid phase diffusion path between the first compound layer and the second compound layer is cut off in formation of the first and second compound layers, whereby the first and second compound layers can be prevented from connection. Consequently, the gate electrode and the impurity regions can be effectively prevented from defective short-circuiting. The solid phase diffusion path between the first and second compound layers is cut off in formation of the first and second compound layers, whereby process tolerance is increased. Thus, the first and second compound layers can be readily formed in lower resistance as compared with the prior art, thereby further reducing the resistance of the gate electrode and the impurity regions as a result. Consequently, the speed of the semiconductor device can be increased. Further, the aforementioned effect ca be attained with a simple structure by providing the side wall insulator film of a single layer having the first concave portion on the side surface of the gate electrode consisting of a single layer.

In the semiconductor device according to the aforementioned aspect, the first concave portion is preferably formed to be depressed sideward from the surface of the side wall insulator film. When the first concave portion is formed in such a manner, a conductor film for forming the first compound layer and the second compound layer can be readily separated with the first concave portion.

In the semiconductor device according to the aforementioned aspect, the side wall insulator film preferably includes an arcuate surface, and an insulator film consisting of a material different in etching rate from the side wall insulator film is preferably formed on the arcuate surface of the side wall insulator film. Thus, the surface of the side wall insulator film can be partially depressed by etching the side wall insulator film through the insulator film serving as a mask, whereby the first concave portion can be readily formed.

In the semiconductor device according to the aforementioned aspect, the side wall insulator film preferably includes a second concave portion formed on an upper portion of the boundary region between the side wall insulator film and the gate electrode, and the first concave portion is preferably formed at a prescribed interval from the second concave portion. When the second concave portion is formed on the upper portion of the boundary region between the side wall insulator film and the gate electrode in the aforementioned manner, an upper portion of the side surface of the gate electrode is exposed. Thus, the first compound layer formed by reaction with the gate electrode is formed also on the side surface of the gate electrode, whereby the resistance of the gate electrode can be further reduced.

A method of fabricating a semiconductor device according to still another aspect of the present invention comprises steps of forming a first conductor film on a channel region provided on the main surface of a semiconductor substrate through a gate insulator film, forming a second conductor film on the first conductor film, forming a reaction preventing film on the second conductor film, performing first treatment on the first conductor film and the second conductor film thereby reacting the first conductor film and the second conductor film with each other for forming a first compound layer, forming a pair of impurity regions at a prescribed interval to hold the channel region therebetween, forming a third conductor film to cover the reaction preventing film and the impurity regions, and performing second treatment thereby reacting the third conductor film and a semiconductor forming the impurity regions for forming a second compound layer while preventing the first compound layer and the second compound layer from reacting with each other by the reaction preventing film during the second treatment. In the present invention, the term "semiconductor substrate" indicates a wide concept including not only a general semiconductor substrate but also a semiconductor thin film or the like.

In the method of fabricating a semiconductor device according the aforementioned aspect, the reaction preventing film prevents the first and second compound layers from reacting with each other during the second treatment, whereby the first and second compound layers are formed independently of each other without reaction and prevented from connection. Thus, the gate electrode and the impurity regions can be readily prevented from defective short-circuiting. The first and second compound layers are formed independently of each other without reaction in formation of the second compound layer, whereby process tolerance is increased. Thus, the first and second compound layers can be readily formed in lower resistance as compared with the prior art.

In the method of fabricating a semiconductor device according to the aforementioned aspect, the reaction preventing film preferably includes a conductive film consisting of a material selected from a group consisting of a low-resistance metal, a high melting point metal and a high melting point metal compound. When formed by such a conductive film, the reaction preventing film serves as parallel resistance of the gate electrode, whereby the resistance of the gate electrode can be further reduced. Consequently, the speed of the semiconductor device can be further increased.

The method of fabricating a semiconductor device according to the aforementioned aspect preferably further comprises a step of forming an interlayer isolation film to cover the second gate film and the second compound layer, and the reaction preventing film preferably contains a material having a high etching selection ratio with respect to the interlayer isolation film. When prepared from a material having a high selection ratio with respect to the material for the interlayer isolation film such as a silicon oxide film in the aforementioned manner, the reaction preventing film can be employed as an etching stopper film when forming a contact hole in the interlayer isolation film by etching. Thus, the contact hole can be effectively prevented from passing through the first compound layer and reaching the first gate film. Consequently, it is possible to prevent deterioration of the gate electrode characteristics resulting from damage of the gate insulator film caused when the contact hole reaches the gate insulator film or deterioration of contact characteristics resulting from reduction of a contact area between the first compound layer and an upper layer wire. In this case, the reaction preventing film preferably includes a film consisting of a material selected from a group consisting of a nitrogen compound, an oxide other than an Si oxide, a high melting point metal and a high melting point metal compound. The reaction preventing film having a high etching selection ratio with respect to the interlayer isolation film consisting of a silicon oxide film or the like can be readily formed by employing the aforementioned material.

In the method of fabricating a semiconductor device according to the aforementioned aspect, the reaction preventing film preferably includes a film consisting of a material selected from a group consisting of a high melting point Si compound, a high melting point metal and a high melting point metal compound. When prepared from such a material having high chemical resistance and high heat resistance, the reaction preventing film can prevent the gate electrode from exposure to a high-temperature mixed solution of ammonia and hydrogen peroxide or the like employed for treatment in a washing step carried out before forming the interlayer isolation film, for example. Further, the reaction preventing film having high heat resistance can effectively prevent the first compound layer, located under the reaction preventing film, from deformation caused by heat.

Preferably, the first treatment includes first heat treatment, the second treatment includes second heat treatment, and the first heat treatment and the second heat treatment are simultaneously performed. Thus, the fabrication process can be simplified as compared with the case of performing the first heat treatment and the second heat treatment independently of each other.

A method of fabricating a semiconductor device according to a further aspect of the present invention comprises steps of forming a first conductor film consisting of a single layer on a channel region provided on the main surface of a semiconductor substrate through a gate insulator film, forming a side wall insulator film consisting of a single layer having a first concave portion on the side surface of the first conductor film, forming a pair of impurity regions at a prescribed interval to hold the channel region therebetween, forming a second conductor film by sputtering to cover the first conductor film and the impurity regions, and performing treatment on the first conductor film, the impurity regions and the second conductor film thereby reacting the first conductor film and the second conductor film with each other for forming a first compound layer while reacting the second conductor film and a semiconductor forming the impurity regions with each other for forming a second compound layer.

In the method of fabricating a semiconductor device according to the aforementioned aspect, the second conductor film for forming the first compound layer and the second compound layer is formed by sputtering after forming the side wall insulator film having the first concave portion, so that the second conductor film is separated in a self-aligned manner with the first concave portion in the process of formation. Thus, a solid phase diffusion path between the first compound layer and the second compound layer is cut off in formation of the first and second compound layers, whereby the first and second compound layers can be prevented from connection. Consequently, a gate electrode (first conductor film) and the impurity regions can be effectively prevented from defective short-circuiting.

Further, process tolerance is increased since the solid phase diffusion path between the first and second compound layers is cut off in formation thereof. Thus, the first and second compound layers can be readily formed in lower resistance as compared with the prior art, so that the resistance of the gate electrode and the impurity regions can be further reduced as a result. Thus, the speed of the semiconductor device can be increased. Further, the side wall insulator film of a single layer having the first concave portion is provided on the side surface of the first conductor film (gate electrode) of a single layer, whereby the aforementioned effect can be attained through a simpler process as compared with the case of employing a plurality of layers.

In the method of fabricating a semiconductor device according to the aforementioned aspect, the step of forming the side wall insulator film having the first concave portion preferably includes steps of forming an insulator film consisting of a material different in etching rate from the side wall insulator film to cover the side wall insulator film and thereafter etching back the insulator film so that the insulator film remains only on a prescribed portion of the surface of the side wall insulator film, and isotropically etching the side wall insulator film through the remaining insulator film serving as a mask thereby forming the first concave portion. When isotropically etching the side wall insulator film through the insulator film remaining only on the prescribed portion of the surface of the side wall insulator film, the first concave portion can be readily formed.

In this case, the method of fabricating a semiconductor device preferably further comprises a step of isotropically etching the side wall insulator film through the remaining insulator film serving as a mask thereby simultaneously forming a second concave portion on an upper portion of the boundary region between the side wall insulator film and the gate electrode in addition to the first concave portion. When the second concave portion is formed on the upper portion of the boundary region between the side wall insulator film and the gate electrode in the aforementioned manner, an upper portion of the side surface of the gate electrode is exposed. Thus, the first compound layer formed by reaction with the gate electrode is also formed on the side surface of the gate electrode, whereby the resistance of the gate electrode can be further reduced. Further, the second concave portion is formed simultaneously with the first concave portion, not to complicate the fabrication process by newly providing the second concave portion.

In the method of fabricating a semiconductor device according to the aforementioned aspect, the step of forming the side wall insulator film having the first concave portion preferably includes steps of forming a resist film exposing a prescribed portion of the side wall insulator film and forming the first concave portion by isotropically etching the side wall insulator film through the resist film serving as a mask. When employing the resist film and isotropic etching in the aforementioned manner, the first concave portion can be readily formed to be depressed sideward from the surface of the side wall insulator film.

In the method of fabricating a semiconductor device according to the aforementioned aspect, the first concave portion is preferably formed to be depressed sideward from the surface of the side wall insulator film. When forming the first concave portion in the aforementioned manner, a conductor film for forming the first and second compound layers can be readily separated with the first concave portion in the process of formation.

In the method of fabricating a semiconductor device according to the aforementioned aspect, the side wall insulator film preferably includes an arcuate surface, and an insulator film consisting of a material different in etching rate from the side wall insulator film is preferably formed on the arcuate surface of the side wall insulator film. Thus, the surface of the side wall insulator film can be partially depressed by etching the side wall insulator film through the insulator film serving as a mask, so that the first concave portion can be readily formed as a result.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

Figure 1:
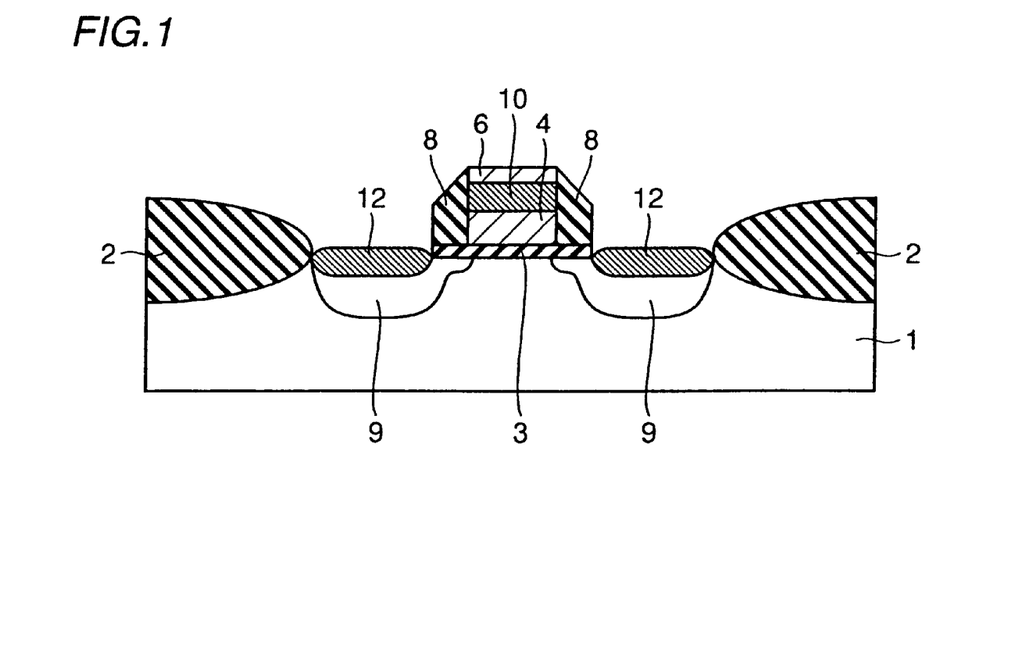
FIG. 1 is a sectional view showing a semiconductor device according to a first embodiment of the present invention.

FIG. 1 is a sectional view for illustrating a semiconductor device according to a first embodiment of the present invention. The semiconductor device according to the first embodiment is now described with reference to FIG. 1.

In the semiconductor device according to the first embodiment, field oxide films 2 are formed on element isolation regions of the main surface of a silicon substrate 1. A pair of source/drain regions 9 are formed on an element forming region enclosed with the field oxide films 2 at a prescribed interval, to hold a channel region therebetween. A first gate film 4 is formed on the channel region through a gate oxide film 3. The first gate film 4 consists of a polycrystalline silicon film having a thickness of about 180 nm. The source/drain regions 9 form the "impurity regions" of the present invention, and the gate oxide film 3 forms the "gate insulator film" of the present invention.

A second gate film consisting of a first Ti silicide film 10 of about 60 nm in thickness is formed on the first gate film 4. The first Ti silicide film 10 forms the "first compound layer" of the present invention. A reaction preventing film 6 consisting of a TiN film having a thickness of about 30 nm is formed on the second gate film. The first gate film 4, the second gate film and the reaction preventing film 6 form a gate electrode. Side wall spacers 8 consisting of insulator films are formed on both side walls of the gate electrode. Second Ti silicide films 12 are formed on the surfaces of the pair of source/drain regions 9. The second Ti suicide films 12 form the "second compound layer" of the present invention.

The aforementioned reaction preventing film 6 prevents the first Ti silicide film 10 and the second Ti silicide films 12 from reacting with each other when the second Ti silicide films 12 are formed in a fabrication process described later. According to the first embodiment, the reaction preventing film 6 is formed by a TiN film as an exemplary film having such a function.

According to the first embodiment, the reaction preventing film 6 of TiN is formed on the second gate film formed by the first Ti silicide film 10 as hereinabove described, whereby the first Ti silicide film 10 and the second Ti silicide films 12 can be effectively prevented from reacting with each other when the second Ti silicide films 12 are formed on the surfaces of the source/drain regions 9. The reaction preventing film 6 is formed by the conductive TiN film, which serves as parallel resistance of the gate electrode. Thus, the resistance of the gate electrode can be further reduced, and the speed of a transistor can consequently be more increased.

FIGS. 2 to 6 are sectional views for illustrating the fabrication process for the semiconductor device according to the first embodiment of the present invention. The fabrication process for the semiconductor device according to the first embodiment is now described with reference to FIGS. 2 to 6.

Figure 2:
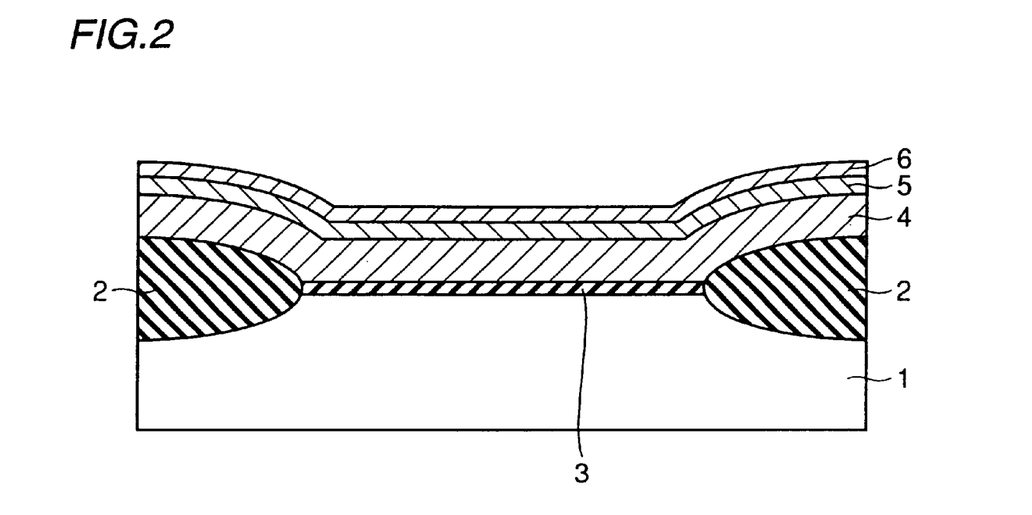
FIGS. 2 to 6 are sectional views for illustrating a fabrication process for the semiconductor device according to the first embodiment of the present invention.

First, the field oxide films 2 are formed on the element isolation regions of the main surface of the silicon substrate 1 by a LOCOS (local oxidation of silicon) method, as shown in FIG. 2. The gate oxide film 3 is formed on the element forming region enclosed with the field oxide films 2. The first gate film 4 of polycrystalline silicon is formed on the gate oxide film 3 by LPCVD (low pressure chemical vapor deposition) in a thickness of about 180 nm. A natural oxide film naturally formed on the first gate oxide 4 is removed and thereafter the first Ti film 5 is formed on the first gate film 4 by sputtering in a thickness of about 35 nm. The reaction preventing film 6 of TiN is formed on the first Ti film 5 by sputtering in a thickness of about 30 nm. The polycrystalline silicon film forming the first gate film 4 corresponds to the "first conductor film" of the present invention, and the first Ti film 5 corresponds to the "second conductor film" of the present invention.

Figure 3:
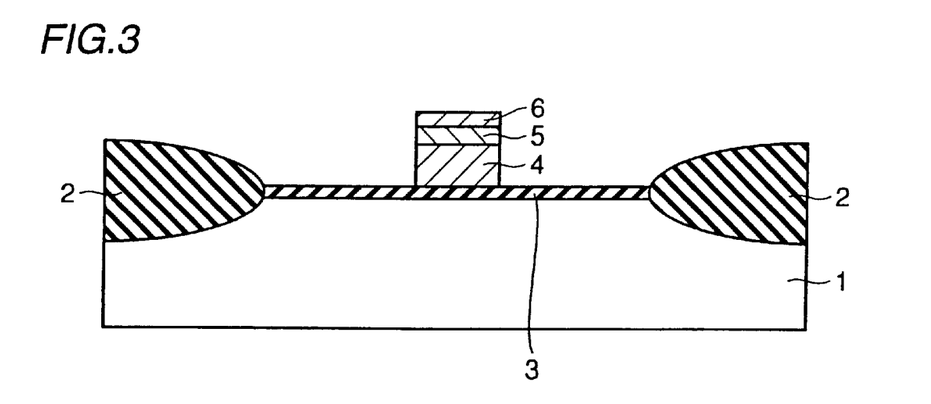

Then, the first gate film 4, the first Ti film 5 and the reaction preventing film 6 are patterned by photolithography and dry etching, thereby forming the gate electrode as shown in FIG. 3.

Then, an impurity is ion-implanted through the gate electrode serving as a mask for forming a low-concentration impurity region and thereafter the side wall spacers 8 are formed on the side walls of the gate electrode. The impurity is ion-implanted again through the side wall spacers 8 and the gate electrode serving as masks, for forming a high-concentration impurity region. The low- and high-concentration impurity regions define the source/drain regions 9 of an LDD (lightly doped drain) structure. The side wall spacers 8 are formed on both side surfaces of the gate electrode by depositing an insulator film on the overall surface and thereafter etching back the same.

Figure 4:
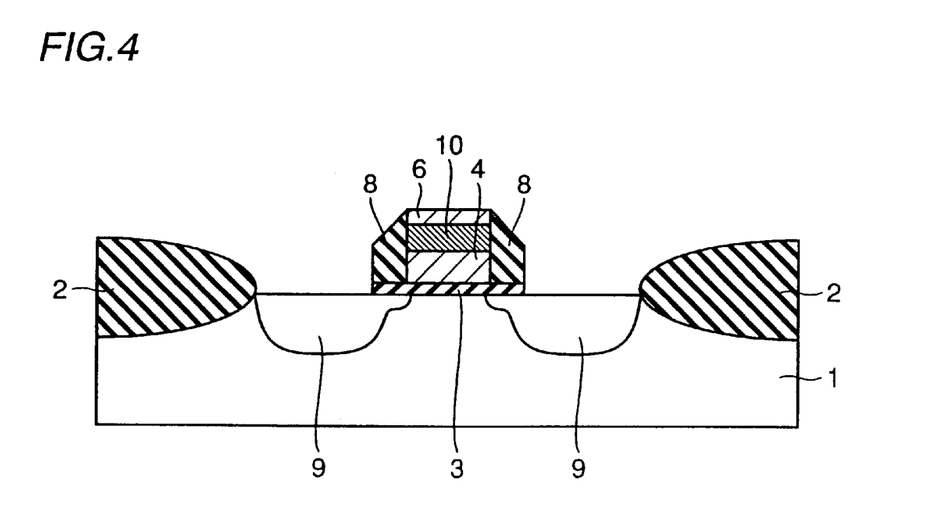

In order to activate the impurity forming the source/drain regions 9, heat treatment is performed by RTA (rapid thermal annealing) under conditions of about 1000° C. and about 10 seconds. This heat treatment results in silicide reaction between the polycrystalline silicon film forming the first gate film 4 and the first Ti film 5, thereby forming the first Ti silicide film 10. The thickness of the first Ti silicide film 10 formed by this silicide reaction is about 60 nm. Further, the first Ti silicide film 10 is converted to a low-resistance silicide film due to the high-temperature heat treatment. This heat treatment corresponds to the "first treatment" of the present invention.

In formation of the first Ti silicide film 10, the surface of the first Ti film 5 is covered with the TiN film 6, not to be exposed to atmosphere gas (e.g., nitrogen) dissimilarly to the conventional salicide process. Thus, no part of the first Ti film 5 is consumed for formation of TiN due to reaction with the atmosphere gas. Consequently, all part of the first Ti film 5 is consumed for the silicide reaction for forming the first silicide film 10, the thickness of which can be increased as compared with the conventional salicide process. Thus, the resistance of the gate electrode can be further reduced.

Figure 5:
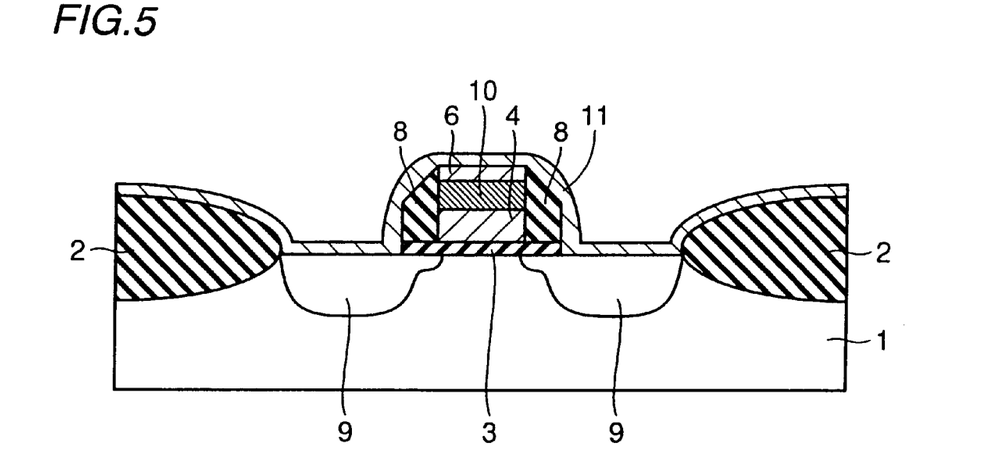

Then, natural oxide films formed on the source/drain regions 9 are removed and thereafter a second Ti film 11 is formed on the overall surface by sputtering in a thickness of about 30 nm, for example, as shown in FIG. 5. The second Ti film 11 forms the "third conductor film" of the present invention.

Figure 6:
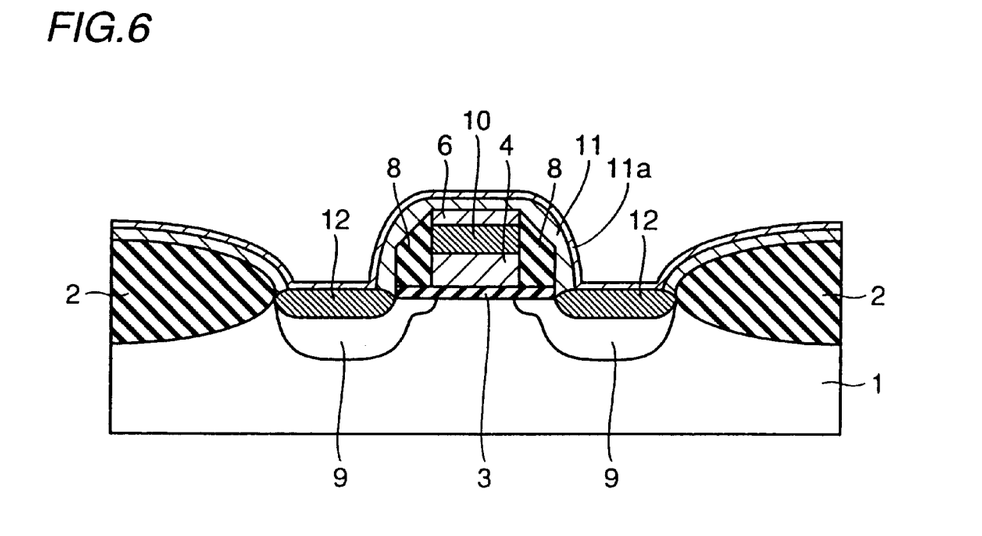

Then, first RTA treatment is performed similarly to the general salicide process, thereby causing silicide reaction between silicon forming the source/drain regions 9 and Ti forming the second Ti film 11 and forming the second Ti silicide films 12 on the source/drain regions 9, as shown in FIG. 6. In the general salicide process, the thickness of the second Ti film 11 is limited to not more than about 40 nm and the annealing temperature for the first RTA treatment is limited to not more than about 700° C., in order to suppress defective bridging.

In the fabrication process according to the first embodiment, on the other hand, the surface of the first Ti silicide film 10 is covered with the reaction preventing film 6 of TiN, whereby no silicide film abnormally grows (see FIG. 18) from the side of the gate electrode. Thus, no defective short-circuiting (bridging) is caused across the gate electrode and the source/drain regions 9, whereby the thickness of the second Ti film 11 can be increased and the first RTA treatment can be performed at a high temperature for a long time. According to the first embodiment, the first RTA treatment can be performed at a high temperature of about 700° C. to about 750° C. for a long time of about 10 seconds to about 60 seconds, for example.

The fabricating method according to the present invention can secure such a wide process margin, whereby the second silicide films 12 can be more reduced in resistance than the conventional salicide process. Thus, the resistance of the source/drain regions 9 can be further reduced. The first RTA treatment corresponds to the "second treatment" of the present invention.

Finally, an unreacted portion of the second Ti film 11 and a TiN film 11a grown on the surface of the second Ti film 11 during the first RTA treatment are removed by treatment with a mixed solution of $H_2SO_4$, $H_2O_2$ and $H_2O$. Annealing is performed by second RTA treatment under conditions of about 850° C. and about 30 seconds, thereby converting the second Ti silicide films 12 to low-resistance silicide films. Thus, the semiconductor device according to the first embodiment is completed as shown in FIG. 1.

(Second Embodiment)

Figure 7:
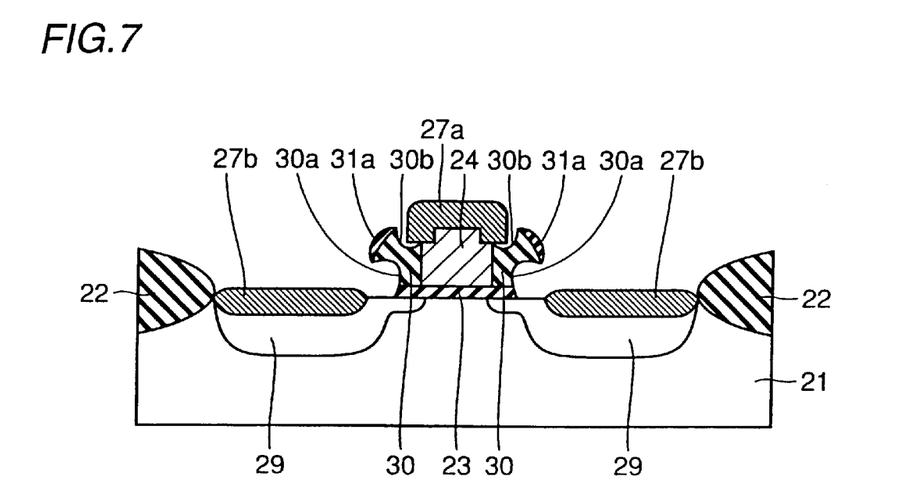
FIG. 7 is a sectional view showing a semiconductor device according to a second embodiment of the present invention.

FIG. 7 is a sectional view for illustrating a semiconductor device according to a second embodiment of the present invention. The semiconductor device according to the second embodiment is now described with reference to FIG. 7.

In the semiconductor device according to the second embodiment, field oxide films 22 are formed on element isolation regions of the main surface of a silicon substrate 21. A pair of source/drain regions 29 are formed on an element forming region enclosed with the field oxide films 22 at a prescribed interval, to hold a channel region therebetween. A gate electrode 24 is formed on the channel region through a gate oxide film 23. This gate electrode 24 is formed by a polycrystalline silicon film of a single layer having a thickness of about 180 nm. The source/drain regions 29 form the "impurity regions" of the present invention, and the gate oxide film 23 forms the "gate insulator film" of the present invention.

A first Ti silicide film 27a of about 60 nm in thickness is formed on the gate electrode 24. The first Ti silicide film 27a forms the "first compound layer" of the present invention. Side wall spacers 30 consisting of $SiO_2$ films are formed to be in contact with both side surfaces of the gate electrode 24. The side wall spacers 30 correspond to the "side wall insulator film" of the present invention.

SiN films 31a are formed on arcuate surfaces of the side wall spacers 30 formed by the $SiO_2$ films. The SiN films 31a correspond to the "insulator film" of the present invention.

According to the second embodiment, first concave portions 30a are formed by depressing the side surfaces of the side wall spacers 30. Therefore, the side wall spacers 30 are in overhanging shapes having upper widths larger than lower widths. According to the second embodiment, further, second concave portions 30b are formed on upper portions of the boundary regions between the side wall spacers 30 and the gate electrode 24, in addition to the first concave portions 30a.

Second Ti silicide films 27b are formed on the surfaces of the pair of source/drain regions 29. The second Ti silicide films 27b form the "second compound layer" of the present invention.

According to the second embodiment, the overhanging side wall spacers 30 having the first concave portions 30a are so provided in the aforementioned manner that a Ti film formed for defining the first and second Ti silicide films 27a and 27b is separated in a self-aligned manner with the first concave portions 30a in the process of formation. Thus, solid phase diffusion paths between the first Ti silicide film 27a and the second Ti silicide films 27b are cut off in formation of the first and second Ti silicide films 27a and 27b, whereby the first and second Ti silicide films 27a and 27b can be prevented from connection. Consequently, the gate electrode 24 and the source/drain regions 29 can be effectively prevented from defective short-circuiting.

According to the second embodiment, the aforementioned effect can be attained with a simple structure by providing the side wall spacers 30 of single layers having the first concave portions 30a on the side surfaces of the gate electrode 24 of a single layer.

According to the second embodiment, further, upper portions of the side surfaces of the gate electrode 24 are exposed due to the provision of the second concave portions 30b as described above. Thus, the first Ti silicide film 27a formed by reaction with the gate electrode 24 is formed also on the side surface portions of the gate electrode 24 as shown in FIG. 7, whereby the resistance of the gate electrode 24 can be further reduced.

FIGS. 8 to 12 are sectional views for illustrating the fabrication process for the semiconductor device according to the second embodiment of the present invention. The fabrication process for the semiconductor device according to the second embodiment is now described with reference to FIGS. 8 to 12.

Figure 8:
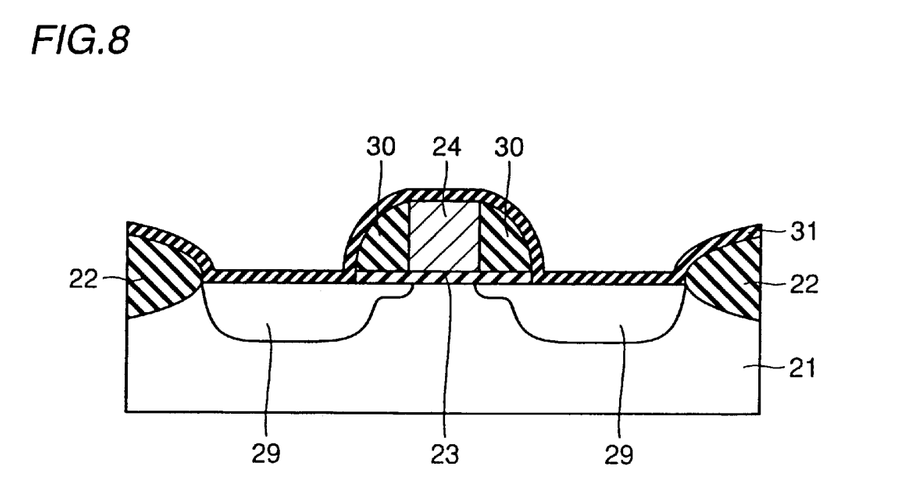
FIGS. 8 to 12 are sectional views for illustrating a fabrication process for the semiconductor device according to the second embodiment of the present invention.

First, the field oxide films 22 are formed on the element isolation regions of the main surface of the silicon substrate 21 by a LOCOS method, as shown in FIG. 8. The gate oxide film 23 is formed on the element forming region enclosed with the field oxide films 22. A polycrystalline silicon film is formed on the gate oxide film 23 by LPCVD in a thickness of about 180 nm, and thereafter patterned by photolithography and dry etching thereby forming the gate electrode 24 of the polycrystalline silicon film of a single layer. The polycrystalline silicon film forming the gate electrode 24 corresponds to the "first conductor film" of the present invention.

Thereafter an impurity is ion-implanted through the gate electrode 24 serving as a mask, thereby forming a low-concentration impurity region. An $SiO_2$ film is formed in a thickness of about 100 nm to cover the overall surface and thereafter totally etched back thereby forming the side wall spacers 30 of $SiO_2$ on the side walls of the gate electrode 24.

The impurity is ion-implanted again through the side wall spacers 30 serving as masks, thereby forming a high-concentration impurity region. Heat treatment is performed for electrically activating the implanted impurity thereby forming the source/drain regions 29 of an LDD structure. Thereafter an SiN film 31 is formed to cover the overall surface.

Figure 9:
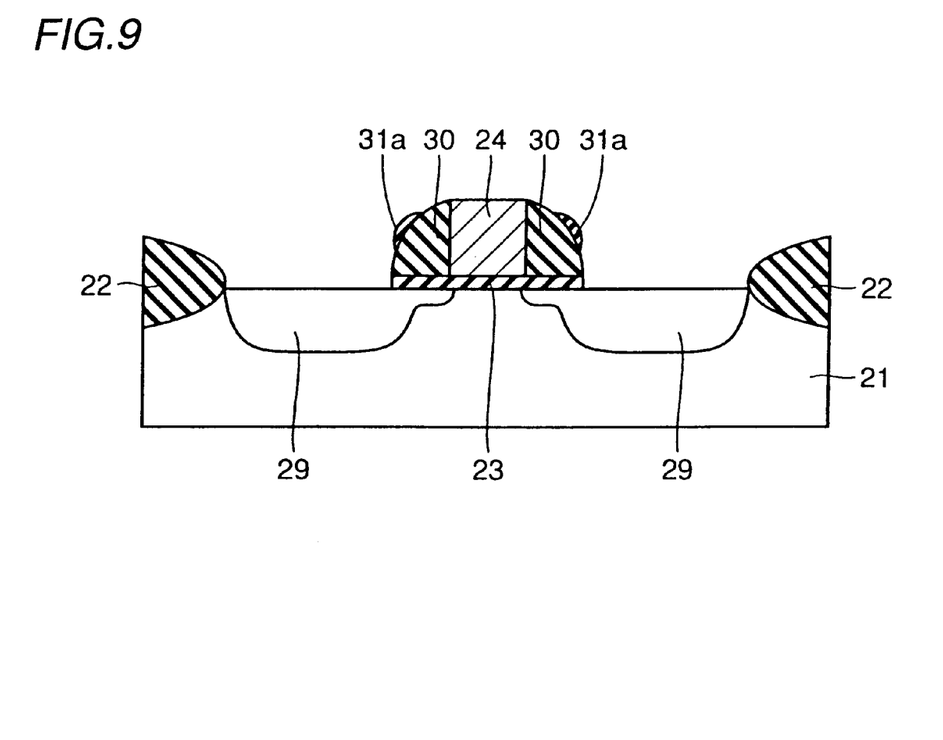

The SiN film 31 is totally etched back so that the SiN films 31a remain only on prescribed portions of the side wall spacers 30, as shown in FIG. 9.

Figure 10:
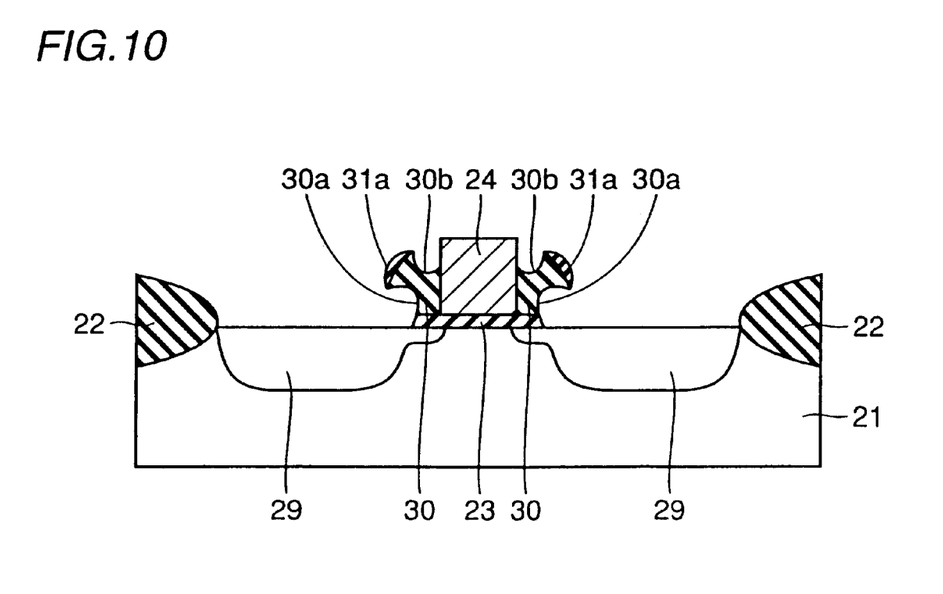

The side wall spacers 30 are isotropically etched with an HF-based chemical solution through the remaining SiN films 31a serving as masks, thereby simultaneously forming the first concave portions 30a and the second concave portions 30b as shown in FIG. 10. Thus, the side wall spacers 30 are formed in the overhanging shapes.

Thus, the first and second concave portions 30a and 30b can be readily formed by isotropically etching the side wall spacers 30 through the SiN films 31a remaining only on the prescribed portions of the surfaces of the side wall spacers 30 consisting of $SiO_2$ films.

Figure 11:
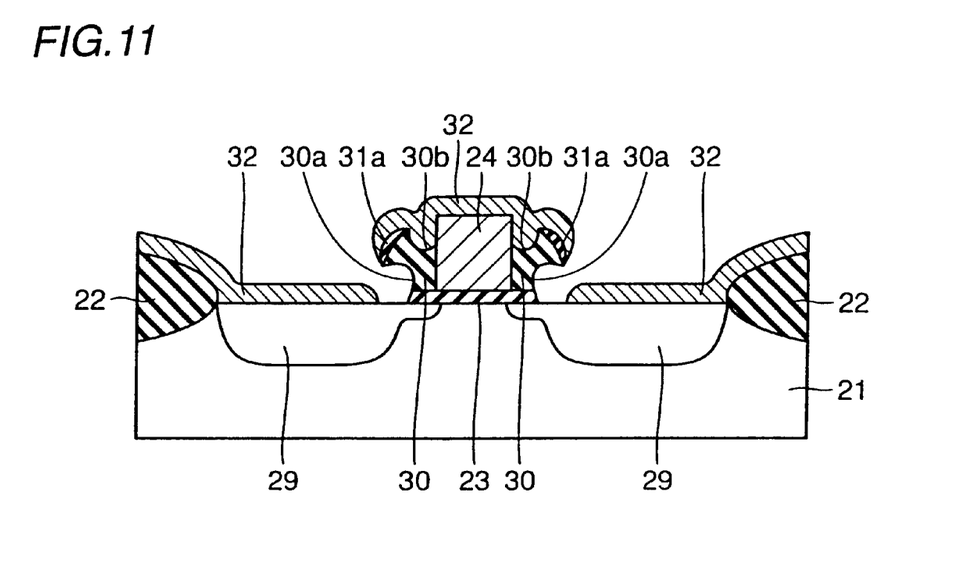

Then, a TiN film 32 having a thickness of about 40 nm is formed by sputtering, as shown in FIG. 11. When formed by sputtering, the TiN film 32 is separated into a portion located on the gate electrode 24 and portions located on the source/drain regions 29 in a self-aligned manner with the first concave portions 30a. This Ti film 32 forms the "second conductor film" of the present invention.

Figure 12:
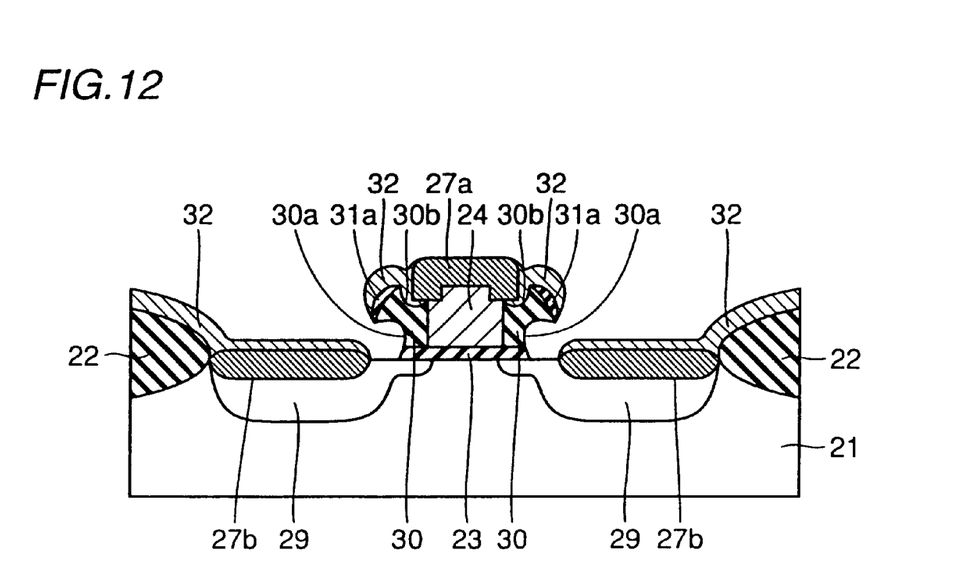

Then, first RTA treatment is performed similarly to the general salicide process for causing silicide reaction between silicon forming the gate electrode 24 and the source/drain regions 29 and Ti forming the Ti film 32, thereby forming the first Ti silicide film 27a and the second Ti silicide films 27b on the gate electrode 24 and the source/drain regions 29 respectively, as shown in FIG. 12. In the general salicide process, the thickness of the Ti film 31 is limited to not more than about 40 nm and the annealing temperature for the first RTA treatment is limited to not more than about 700° C., for example, in order to suppress defective bridging.

In the fabrication process according to the second embodiment, on the other hand, the Ti film 32 for forming the first Ti silicide film 27a and the second Ti silicide films 27b is separated into the portion located on the gate electrode 24 and the portions located on the source/drain regions 29 in a self-aligned manner, whereby solid phase diffusion paths between the first Ti silicide film 27a and the second TI silicide films 27b are cut off. Thus, no silicide film abnormally grows (see FIG. 18) from the side of the gate electrode 24. Therefore, the gate electrode 24 and the source/drain regions 29 cause no defective short-circuiting (bridging), and hence the thickness of the Ti film 32 can be increased while the first RTA treatment can be performed at a high temperature for a long time. According to the second embodiment, the first RTA treatment is performed at about 740° C. for about 15 seconds, for example.

Thus, the first Ti silicide film 27a and the second Ti silicide films 27b can be readily formed in lower resistance as compared with the prior art, and the resistance of the gate electrode 24 and the source/drain regions 29 can be further reduced as a result. The first Ti silicide film 27a formed by reaction with the gate electrode 24 is formed also on side surface portions of the gate electrode 24 (see FIG. 12) due to the provision of the second concave portions 30b, whereby the resistance of the gate electrode 24 can be further reduced. The second concave portions 30b are simultaneously formed with the first concave portions 30a, not to increase the number of the fabrication steps.

Finally, an unreacted portion of the Ti film 32 and a TiN film (not shown) grown on the surface of the Ti film 32 during the first RTA treatment are removed by treatment with a mixed solution of $H_2SO_4$, $H_2O_2$ and $H_2O$. Annealing is performed by second RTA treatment under conditions of about 850° C. and about 30 seconds, thereby converting the first and second Ti silicide films 27a and 27b to low-resistance silicide films. Thus, the semiconductor device according to the second embodiment is completed as shown in FIG. 7.

Although the present invention has been described and illustrated in detail, it is clearly understood that the same is by way of illustration and example only and is not to be taken by way of limitation, the spirit and scope of the present invention being limited only by the terms of the appended claims.

(1) For example, while the present invention is applied to a semiconductor device formed on a silicon substrate in each of the aforementioned first and second embodiments, the present invention is not restricted to this but is also applicable to a semiconductor device such as an LCD formed on a semiconductor thin film, for example.

(2) While the first Ti silicide film 10 is formed by the heat treatment for activating the source/drain regions 9 in the step shown in FIG. 4 and thereafter the second Ti silicide film 12 is formed by the first RTA treatment in the step shown in FIG. 6 in the first embodiment, the present invention is not restricted to this but the heat treatment for activation may be omitted in the step shown in FIG. 4 for simultaneously performing activation of the source/drain regions 9, formation of the first Ti silicide film 10 and formation of the second Ti silicide film 12 by the first RTA treatment in the step shown in FIG. 6. Thus, the fabrication process can be simplified.

(3) While the Ti silicide films are formed on the gate electrode and the source/drain regions in each of the aforementioned first and second embodiments, the present invention is not restricted to this but is also applicable to a process of forming Co silicide films. Further, the metal to be silicified may be prepared from a high melting point metal other than Ti and Co, such as nickel (Ni), molybdenum (Mo), tungsten (W), tantalum (Ta), hafnium (Hf), zirconium (Zr), niobium (Nb), vanadium (V), rhenium (Re), chromium (Cr), platinum (Pt), iridium (Ir), osmium (Os), rhodium (Rh) or the like, for example.

(4) While the present invention is applied to the process of forming silicide on the gate electrode and the source/drain regions in the aforementioned first embodiment, the present invention is not restricted to this but is also applicable to a process of forming a gate electrode of lower resistance by reacting two types of gate materials other than silicide on a substrate.

(5) While the reaction preventing film 6 is formed by a TiN film in the first embodiment, the present invention is not restricted to this but the reaction preventing film 6 may be prepared from the following conductive or insulating material:

(i) The reaction preventing film 6 may be prepared from a low-resistance metal such as Al, Cu, Ag, Pt or Au, a high melting point metal such as W or Ta or a high melting point metal compound, for example. When prepared from such a conductive material, the reaction preventing film 6 serves as parallel resistance of the gate electrode, whereby the resistance of the gate electrode can be reduced similarly to the aforementioned case of TiN. Consequently, the speed of the semiconductor device can be increased.

(ii) The reaction preventing film 6 may be prepared from a nitrogen compound such as SiN or WN, an oxide such as $TiO_2$ or $Al_2O_3$ other than an Si oxide, a high melting point metal such as W or Ta or a high melting point metal compound. Such a material has a high selection ratio with respect to the material for the interlayer isolation film such as a silicon oxide film, whereby the reaction preventing film 6 can be employed as an etching stopper film when forming a contact hole in the interlayer isolation film by etching.

Figure 13:
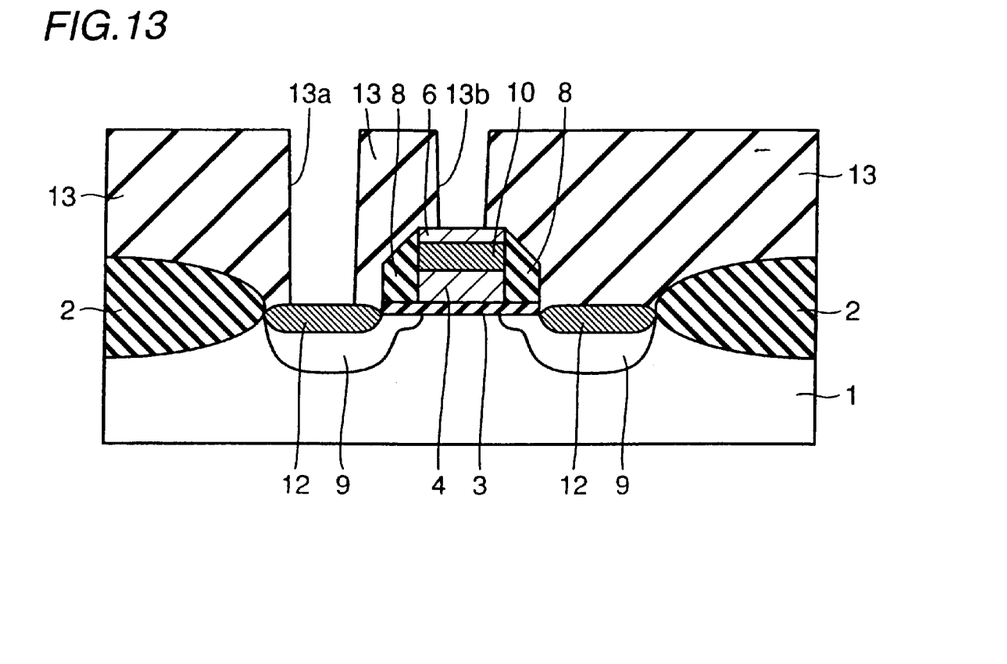
FIG. 13 is a sectional view showing a modification of the semiconductor device according to the first embodiment of the present invention.

When forming contact holes 13a and 13b in an interlayer isolation film 13 by etching as shown in FIG. 13, the reaction preventing film 6 serves as an etching stopper film, thereby effectively preventing the contact hole 13b from passing through the first Ti silicide film 10 and reaching the first gate film 4. Consequently, it is possible to effectively prevent deterioration of the gate electrode characteristics resulting from damage of the gate oxide film 3 when the contact hole 13b reaches the gate oxide film 3 or deterioration of contact characteristics resulting from reduction of the contact area between the first Ti silicide film 10 and an upper layer wire.

Figure 14:
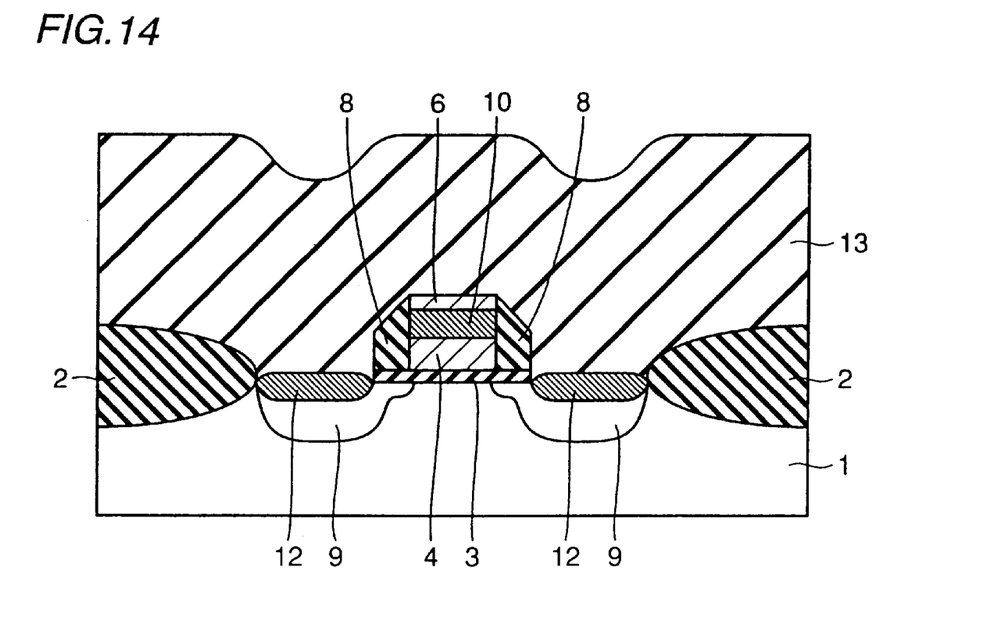
FIGS. 14 and 15 are sectional views for illustrating a fabrication process for a semiconductor device according to the modification shown in FIG. 13.
Figure 15:
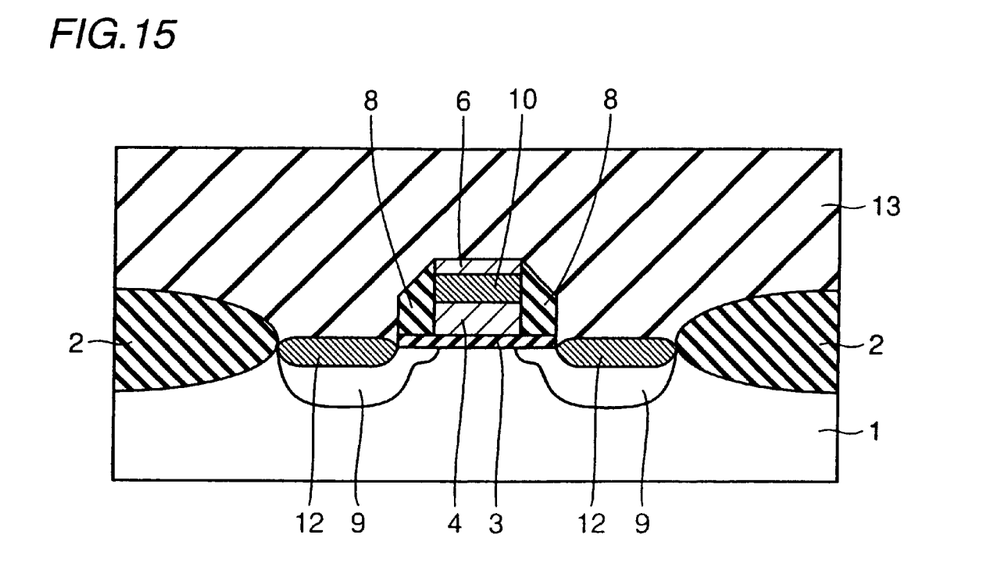

In order to form the interlayer isolation film 13 shown in FIG. 13, the interlayer isolation film 13 is first formed in a thickness of about 900 nm to cover the overall surface, as shown in FIG. 14. This interlayer isolation film 13 is formed by a single layer or a multilayer film of a plurality of layers selected from a group consisting of a BPSG film, a silicon oxide film or a silicon nitride film formed by LPCVD and a plasma TEOS oxide film, for example. Thereafter the surface of the interlayer isolation film 13 is flattened by CMP (chemical mechanical polishing) or the like, for obtaining a flat interlayer isolation film 13 shown in FIG. 15. Thereafter the contact holes 13a and 13b for connection with the upper layer wire are formed in the interlayer isolation film 13 by photolithography and dry etching, as shown in FIG. 13.

(iii) The reaction preventing film 6 may be prepared from a high melting point Si compound (insulating material) such as SiN, SiON or SiO$_2$, a high melting point metal or a high melting point metal compound (conductive material). Such a material has high chemical resistance and high heat resistance, whereby the reaction preventing film 6 can prevent the gate electrode from exposure to a high-temperature mixed solution of ammonia and hydrogen peroxide employed in a washing step carried out before forming the interlayer isolation film, for example. Further, the heat-resistant reaction preventing film 6 can prevent the first silicide film 10, located under the reaction preventing film 6, from deformation caused by heat.

Figure 16:
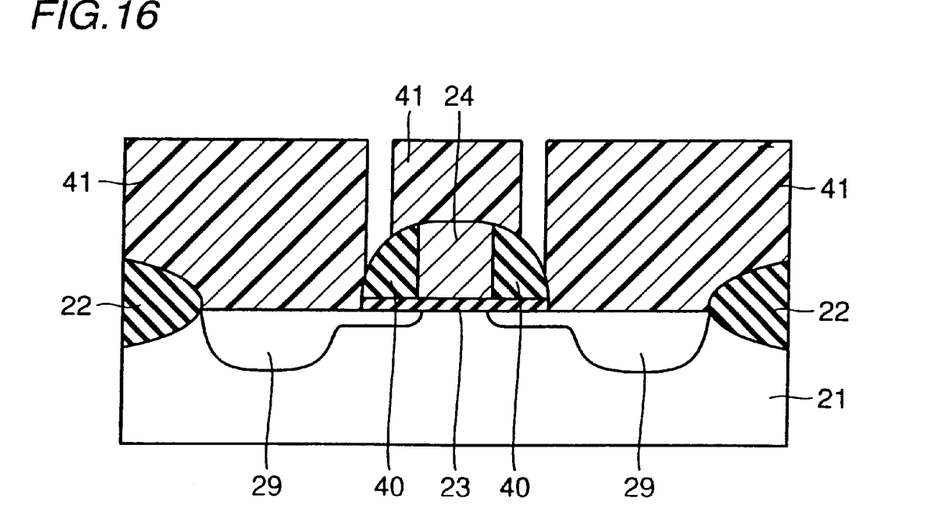
FIGS. 16 and 17 are sectional views for illustrating a modification of the fabrication process for the semiconductor device according to the second embodiment of the present invention.
Figure 17:
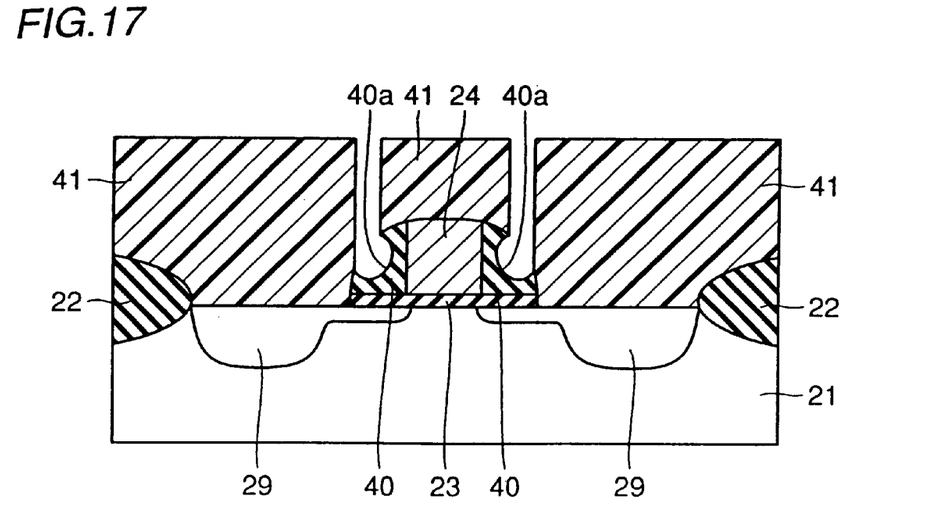

(6) The following modification is also conceivable as a process for forming the first concave portions according to the second embodiment: First, side wall spacers 40 consisting of SiO$_2$ are formed on the side surfaces of a gate electrode 24 and thereafter a resist film 41 is formed to expose prescribed portions of the side wall spacers 40, as shown in FIG. 16. The side wall spacers 40 are isotropically etched with an HF-system chemical solution through the resist film 41 serving as a mask, thereby forming first concave portions 40a as shown in FIG. 17. Thus, the first concave portions 40a can be readily formed to be depressed sideward from the surfaces of the side wall spacers 40 by employing the resist film 41 and isotropic etching.

What is claimed is:

1. A semiconductor device comprising:
   a pair of impurity regions formed on the main surface of a semiconductor substrate at a prescribed interval to hold a channel region therebetween;
   a first gate film formed on said channel region through a gate insulator film;
   a second gate film consisting of a first metal silicide layer formed on said first gate film;
   a second layer of a metal silicide formed on the surfaces of said impurity regions; and
   a conductive reaction preventing film formed on said second gate film for preventing reaction between said first metal silicide layer and said second metal silicide layer, but not on the surfaces of said impurity regions, wherein
   said conductive reaction preventing film includes a conductive film consisting of a material selected from the group consisting of a high melting point Si compound and a high melting point metal compound.

2. The semiconductor device according to claim 1, wherein said conductive reaction preventing film includes a film consisting of said high melting point Si compound.

3. A semiconductor device comprising:
   a pair of impurity regions formed on the main surface of a semiconductor substrate at a prescribed interval to hold a channel region therebetween;
   a first gate film formed on said channel region through a gate insulator film;
   a second gate film consisting of a first metal silicide layer formed on said first gate film;
   a second layer of a metal silicide formed on the surfaces of said impurity regions;
   a conductive reaction preventing film formed on said second gate film for preventing reaction between said first metal silicide layer and said second metal silicide layer, but not on the surfaces of said impurity regions; and
   an interlayer isolation film formed to cover said second gate film and said second metal silicide layer, wherein
   said conductive reaction preventing film contains a material having a high etching selection ratio with respect to said interlayer isolation film selected from the group consisting of a nitrogen compound and a high melting point metal compound.

4. The semiconductor device according to claim 3, wherein
   said conductive reaction preventing film includes a film consisting of said nitrogen compound.

* * * * *